United States Patent
Kauffman et al.

(10) Patent No.: US 7,592,593 B2
(45) Date of Patent: Sep. 22, 2009

(54) MULTI-BAND FOCAL PLANE ARRAY

(75) Inventors: Christopher Lee Kauffman, Lake Zurich, IL (US); Gerald Pray Griffith, Western Springs, IL (US); Ronald B. Jones, Mundelein, IL (US); Sung-Shik Yoo, Palatine, IL (US); Michael A. Davis, Barrington, IL (US)

(73) Assignee: Northrop Grumman Corporation, Los Angelas, CA (US)

( * ) Notice: Subject to any disclaimer, the term of this patent is extended or adjusted under 35 U.S.C. 154(b) by 162 days.

(21) Appl. No.: 11/493,121

(22) Filed: Jul. 26, 2006

(65) Prior Publication Data

US 2009/0173883 A1 Jul. 9, 2009

(51) Int. Cl.
*H01L 25/00* (2006.01)

(52) U.S. Cl. .................................. 250/332; 250/339.05

(58) Field of Classification Search ................. 250/332, 250/339.05
See application file for complete search history.

(56) References Cited

U.S. PATENT DOCUMENTS

| | | | | |
|---|---|---|---|---|
| 5,149,956 A | * | 9/1992 | Norton | 257/188 |
| 5,373,182 A | * | 12/1994 | Norton | 257/440 |
| 5,512,750 A | * | 4/1996 | Yanka et al. | 250/338.4 |
| 5,952,646 A | * | 9/1999 | Spartiotis et al. | 250/208.1 |
| 5,981,950 A | * | 11/1999 | Wolny et al. | 250/338.4 |
| 6,107,618 A | * | 8/2000 | Fossum et al. | 250/208.1 |
| 6,690,012 B1 | | 2/2004 | Jacksen et al. | |
| 6,734,516 B2 | | 5/2004 | Jacksen et al. | |
| 6,822,213 B2 | * | 11/2004 | Stark | 250/208.1 |
| 6,875,975 B2 | * | 4/2005 | Faska et al. | 250/214.1 |
| 2003/0001093 A1 | * | 1/2003 | Wood | 250/332 |
| 2003/0029989 A1 | * | 2/2003 | Stettner et al. | 250/208.1 |

* cited by examiner

*Primary Examiner*—David P Porta
*Assistant Examiner*—Jessica L Eley
(74) *Attorney, Agent, or Firm*—Stetina Brunda Garred & Brucker

(57) ABSTRACT

A multi-band focal plane array architecture operative to detect multiple spectral image. The multi-band focal plane array architecture has an integrated readout circuit, a plurality of first detectors integrated in the readout circuit and a plurality of second detectors deposited on the readout circuit. Preferably, the first detectors are operative to detect visible signals and the second detectors are operative to detect infrared signals. The first and second detectors are arranged in a checkerboard pattern, in alternate rows or columns, or at least partially overlapped with each other to realize simultaneous detection in two different wavelength bands. The architecture may also have an additional integrated readout circuit flip-chip bonded to the integrated readout circuit. By forming a plurality of third detectors on the additional integrated readout circuit, a tri-band focal plane array may be realized. In one embodiment, a dual-band focal plane array architecture by forming two arrays of detectors on two individual integrated readout circuit and flip-chip bonding these two readout circuits.

32 Claims, 5 Drawing Sheets

MULTI-BAND FOCAL PLANE ARRAY

CROSS-REFERENCE TO RELATED APPLICATIONS

Not Applicable

STATEMENT RE: FEDERALLY SPONSORED RESEARCH/DEVELOPMENT

Not Applicable

BACKGROUND

The present invention relates in generally to a focal plane array, and more particularly, to a multi-band focal plane array (FPA) architecture.

The military has multiple needs for day and night surveillance and reconnaissance. The ultimate goal of an optical imaging sensor is to achieve a high probability of detection of a target while simultaneously maintaining an acceptably low false alarm rate. As a target has a spectral reflectivity or emissivity that varies from the background or from clutter, it is often desirable to detect light from the target in two or more wavebands. Thereby, the target can be detected using the response in the two or three wavebands compared to the response of the focal plane array to the background or clutter in these wavebands. It is also desirable for performing target discrimination in one focal plane array instead of using separate focal plane arrays at elevated temperature.

Research has thus been intensely performed to realize a single focal plane array operative to detect a target over multiple spectral ranges. Currently, simultaneous multi-band detection for a single focal plane array is still limited within the infrared range, that is, many of the currently available detectors are only operative to perform simultaneous detection at long-wavelength infrared (LWIR), medium-wavelength infrared (MWIR), and short-wavelength infrared (SWIR) bands. In addition, many of these detectors are only operable while being cryogenically cooled.

BRIEF SUMMARY

A multi-band focal plane array architecture is provided to detect light in two or three wavebands simultaneously. The wavebands include visible wavelength band and short and medium infrared wavelength bands. The architecture may include a single integrated readout circuit and a focal plane array that includes visible detectors and infrared detectors arranged in checkerboard pattern or in alternate rows or columns. Alternatively, two integrated readout circuits each carry at least one array of detectors are flip-chip bonded to each other to provide multi-band detection and/or improved resolution in detection at a specific band. Preferably, the focal plane array architecture as disclosed uses silicon and IV-VI based photon detectors which are capable of operating at temperatures that do not require cryogenic cooling.

The focal plane array architecture as provided includes an M×N array of detector elements each having a substrate with a built-in readout circuit, at least one first detector integrated in the substrate at a first side thereof, and a second detector deposited on the first side of the substrate. The first detector includes a visible detector such as a CMOS detector or a CCD detector, while the second detector includes an IR detector operative to detect short or medium wavelength infrared light. When the first detector and the second detector are arranged side by side on the substrate, light at the visible range and the IR range incident on the substrate at the first side thereof, though being detected simultaneously, are not coincident. When the first detector and the second detector are vertically aligned with each other, light at the visible range and the IR range incident on the substrate at a second side opposite to the first side are expected to penetrate through the substrate and incident on the first detector. As the visible detector is transmissive to the IR wavelength range, the light will transmit through the visible detector and incident on the IR detector. Thereby, the visible light and the IR wavelength are coincident to the first and second detectors. In one embodiment, each of the detector elements may includes more than one visible detector to enhance the resolution of the detection in the visible wavelength range.

In the embodiment comprising two integrated readout circuits flip-chip bonded to each other, at least one array of detectors may be deposited on or integrated in each integrated readout circuit. When each of the integrated readout circuits comprises exactly one array of detectors operative to detect light at two different wavelength bands, a dual-band focal plane array is provided. The array of detectors can also be selected to detect the same wavelength bands of light with an improved resolution. In one embodiment, when one of the integrated readout circuits incorporates more than one array of detectors, detection at three different wavebands can be achieved.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
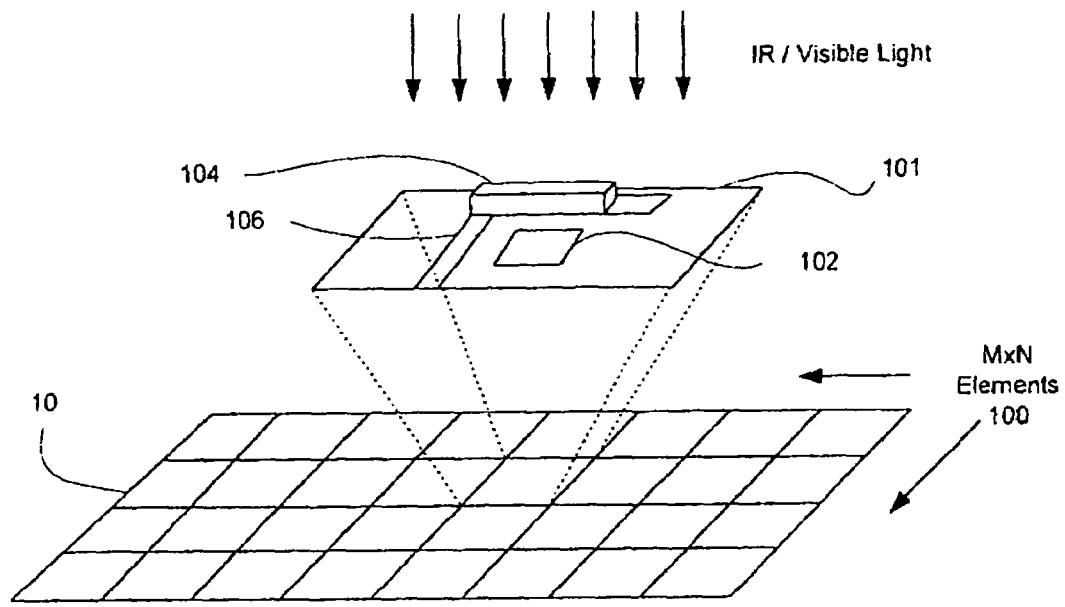
FIG. 1 shows a first embodiment of a multi-band uncooled focal plane array architecture.

FIG. 1 shows a perspective view of dual-band focal plane array architecture in the form of a silicon-based readout integrated circuit (Si ROIC) 10 partitioned into an M×N array of Si-based readout elements 100, where M and N can be any positive integer. Each of the Si-based readout elements 100 further includes a silicon substrate 101 in which a readout integrated circuit and interconnection are formed (not shown), a visible detector 102, an IR detector 104, and a metal bus 106 for buffering an IR signal generated by the IR detector 104. As silicon is transmissive past 1.1 microns up to about 9 microns and operative to absorb light below 1.1 microns; while such light properties of silicon are not or are only slightly affected doping in the predefined wavebands, the visible detector 102 can be integrated in the form of Si CMOS detector in substrate 101 and fabricated by using any p-n junction available in the CMOS process. Depending on the desired waveband, the IR detector 104 may be made of lead sulfide (PbS) to absorb short-wave infrared (SWIR) light up to 3.0 microns or lead selenide (PbSe) to absorb medium-wave infrared light (MWIR) up to 5.0 microns or lead telluride to absorb medium wavelength light up to about 4.5 microns. The IR detector 104 is preferably deposited on silicon substrate 101. The metal bus 106 is preferably in the form of a metal line formed on the silicon substrate 101 to serve as a common bias to all detectors on the focal plane array. Alternatively, bias can be supplied to each detector individually. Preferably, both the visible detector 102 and the IR detector 104 are operable at temperature higher than the cryogenic temperature. Therefore, a cryogenic system is not required to not only simplify the architecture, but also lower the cost of the architecture. Thus designed, both the visible wavelength band and the IR wavelength band of signals can be detected simultaneously. However, as the visible detector 102 and the IR detector 104 are arranged side by side on the substrate 101, the visible wavelength band and the IR wavelength band of signals are not coincident. Further, as each of the readout elements 100 comprises the same numbers of visible detector 102 and IR detector 104, the resolution for both visible and IR bands of light is the same.

Figure 2:
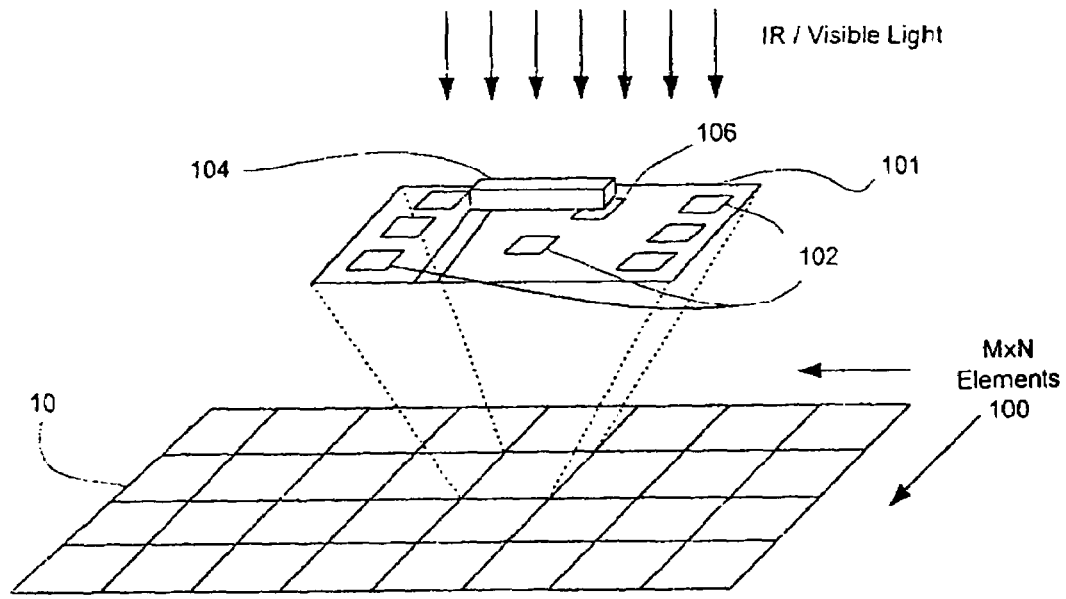
FIG. 2 shows a modification of the multi-band uncooled focal plane array architecture as shown in FIG. 1.

FIG. 2 illustrates a modification of the multi-band focal plane array architecture as shown in FIG. 1. As shown, the modified focal plane array architecture includes a Si-based readout integrated circuit 10 partitioned into an N×M array of Si-based detector elements 100. Each of the Si-based detector elements 100 includes a silicon substrate 101, a readout integrated circuit formed in the substrate 101, a plurality of visible detectors 102 integrated in the substrate 101, and an IR detector 104 deposited on the substrate 101 and surrounded by the visible detector 102. This design provides higher resolution of visible range than IR range to take advantages of the smaller diffraction limited blur in the visible range. Similar to the first embodiment, the visible detectors 104 may be in the form of silicon CMOS integrated in the corresponding readout element 100 by using p-n junction in any available CMOS process. Again, as buffers are required for both the visible and IR signals generated by the visible 102 and IR detectors 104, it is relatively difficult to read out both with a CCD channel.

Figure 3:
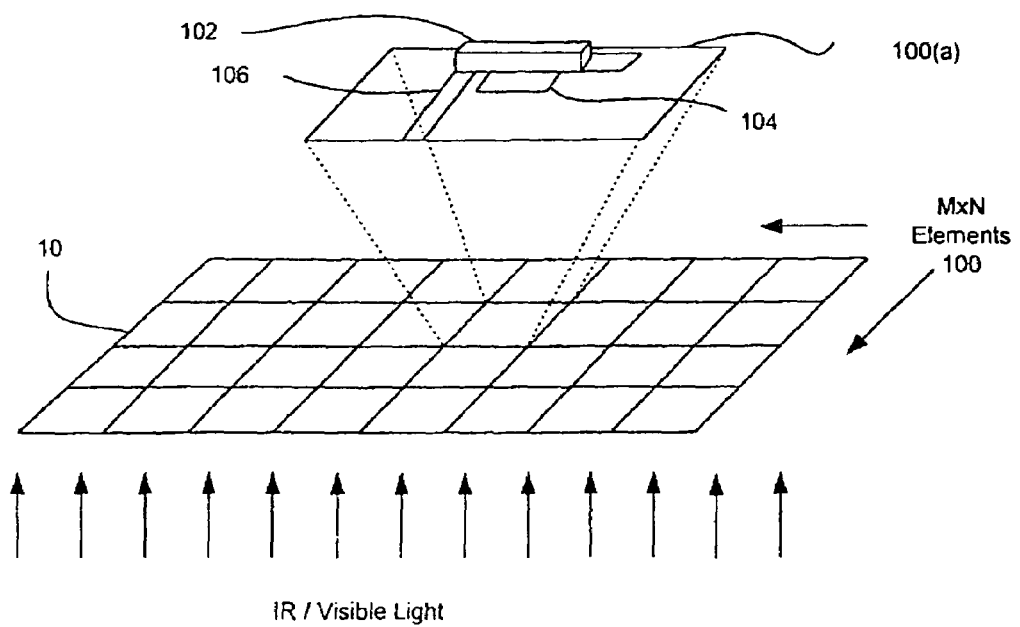
FIG. 3 shows a second embodiment of a multi-band uncooled focal plane array architecture.
Figure 4:
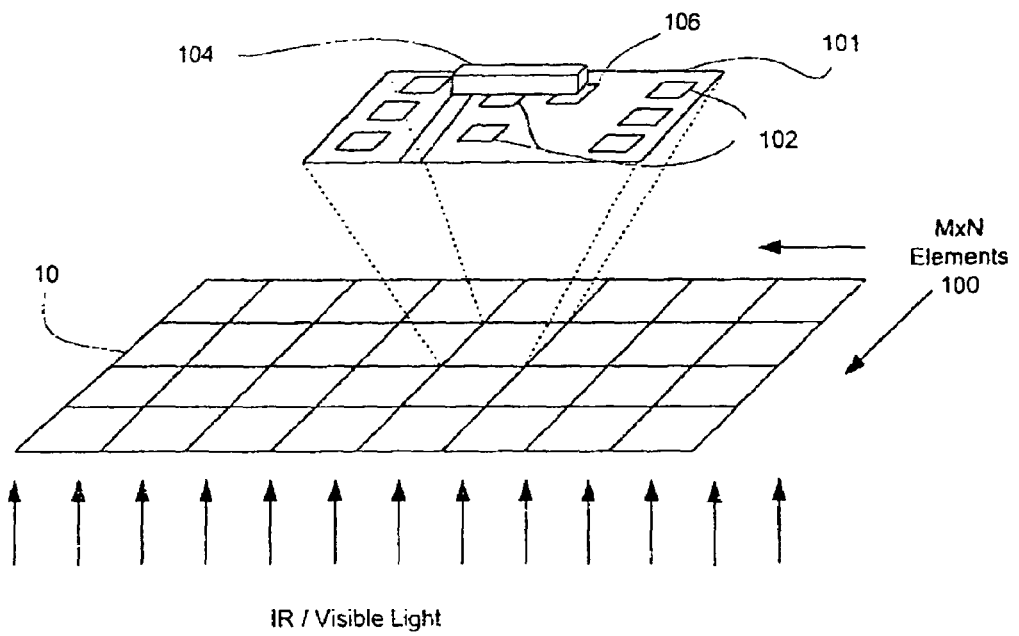
FIG. 4 shows a modification of the multi-band uncooled focal plane array architecture as shown in FIG. 3.
Figure 9:
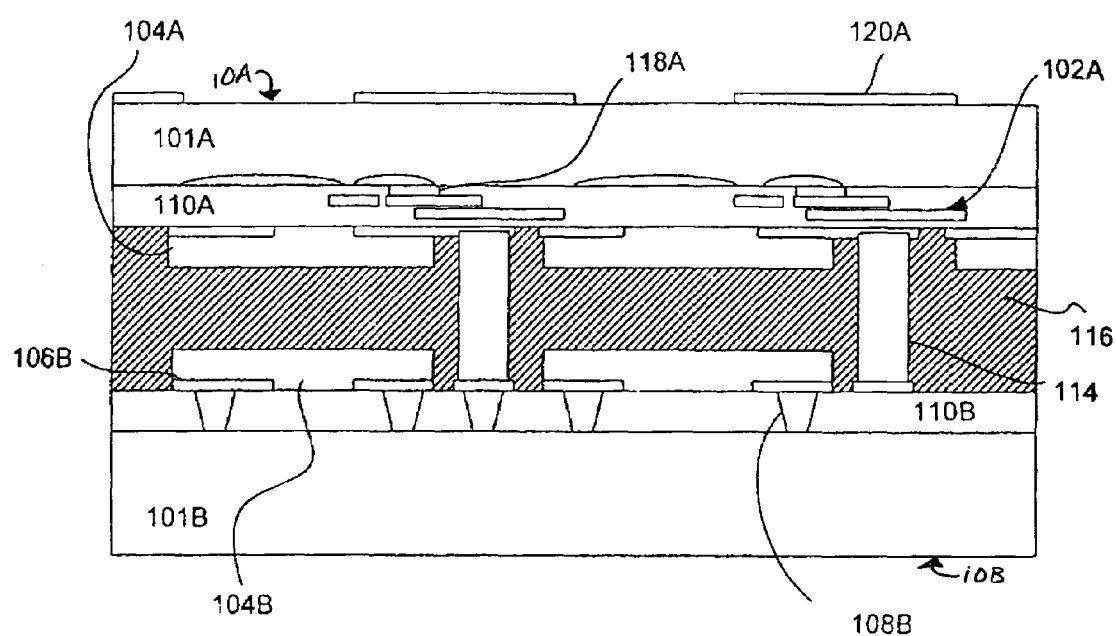
FIG. 9 shows a cross sectional view of a second example of the tri-band focal plane array architecture as shown in FIG. 7.

The multi-band focal plane array architectures as shown in FIGS. 1 and 2 are operative to detect a light in the range of visible and IR wavelengths incident on the surface of the substrate on which the visible and IR detectors 102 and 104 are formed. FIGS. 4 and 3 provide transmissive types of multi-waveband focal plane array architectures. As shown in FIG. 3, the IR detector 104 is deposited over the visible detector 102 integrated in the silicon substrate 101. As the silicon-based visible detector 102 is transmissive to the waveband to be detected by the IR detector 104, the radiation or light in visible and IR wavebands are coincident. As the light is incident from the rear surface of the readout integrated circuit 10, metallization on the rear surface is required to prevent incident light from interacting with the readout circuits formed in the silicon substrate 101. Openings in this back metallization will allow light to penetrate through the silicon substrate 101 such that it is incident only on the visible and IR detectors 102 and 104. The metallization 102A can be referred to the cross sectional view as shown in FIG. 9. The architecture as shown in FIG. 3 includes the same number of the visible detectors 102 and IR detectors 104, such that the visible resolution is substantially the same as the IR resolution. FIG. 4 shows a modification of the multi-band focal plane array architecture as shown in FIG. 3. As shown, each of the readout elements 100 includes more visible detectors 102 than IR detector 104, such that the visible resolution is higher than the IR resolution. In addition, the IR detector 104 is deposited over at least one of the visible detectors 102, such that detection of visible light and IR light are coincident, but with different resolution.

Figure 5:
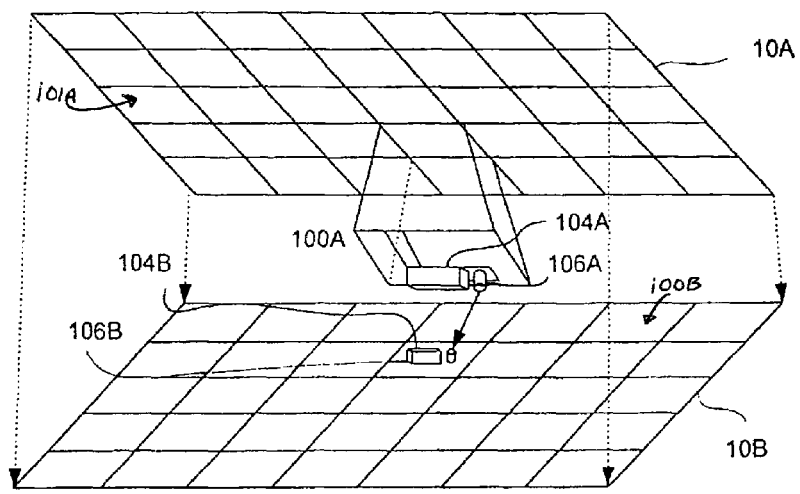
FIG. 5 shows a hybrid dual band array architecture.
Figure 6:
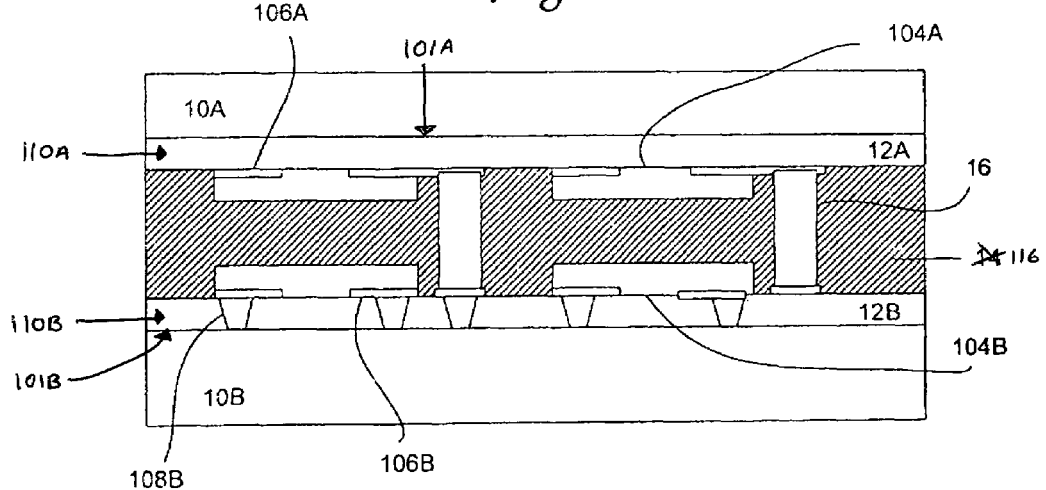
FIG. 6 shows a cross-sectional view of a first example of the hybrid duel band array architecture as shown in FIG. 5.

FIG. 5 provides an embodiment of a multi-waveband focal plane array architecture having a flip-chip bonded or hybridized structure. As shown, the architecture includes two face-to-face readout integrated circuits 10A and 10B. The readout integrated circuits 10A and 10B are partitioned into an array of readout elements 100A and 100B, respectively. Each readout element 100A includes a substrate 101A, a lead salt detector 104A formed on the substrate 101A, and a metallization 106A connecting the lead salt detector 104A to the ROIC unit cell 100B via metallization 108B. Referring to the cross sectional view as shown in FIG. 6, to allow back illumination, that is, to allow light to penetrate through the substrate 101A and incident on the lead salt detector 104A, the substrate 101A is thin and transparent. The lead salt detector 104A includes a PbS detector or a PbTe detector operative to absorb and respond to medium wavelength IR light or short wavelength IR light. A passivation layer 110A is formed on the thin transparent substrate 101A and the lead salt detector 104 and other devices are formed on the passivation layer 110A. Each of the readout elements 100B includes a substrate of readout circuit 101B, a lead salt detector 104B such as a PbTe or PbSe detector for detecting medium wavelength IR light. Preferably, a passivation layer 110B is formed on the substrate 101B, and the lead salt detector 104B formed on the passivation layer 110B and is electrically connected to the readout circuit embedded in the substrate 101B through a connecting pad 106B and an interconnect bump 108B extending through the passivation layer 110B. The readout integrated circuit 100A also includes at least one connecting pad 106A connected to a conductive bump 16 such as an indium bump, so as to establish connection between the readout integrated circuits 10A and 10B. The architecture as shown in FIGS. 5 and 6 is operative to detect coincident short-medium (below 4.5 microns) or short wavelength IR light incident on the lead salt detector 104A and medium wavelength IR light extending through the readout integrated circuit 10A. Therefore, the backfill material 116 introduced between the readout integrated circuits 10A and 10B is preferably transparent to at least the medium wavelength IR light.

Figure 7:
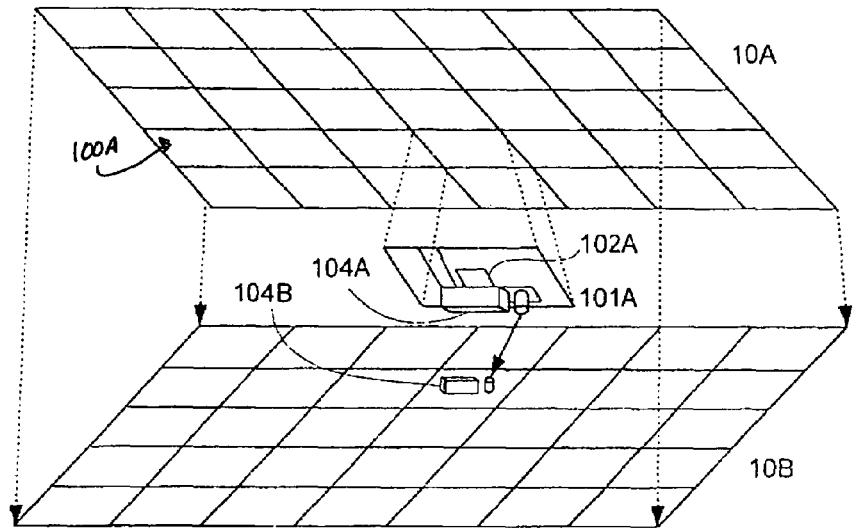
FIG. 7 shows a perspective view of a tri-band focal plane array architecture.
Figure 8:
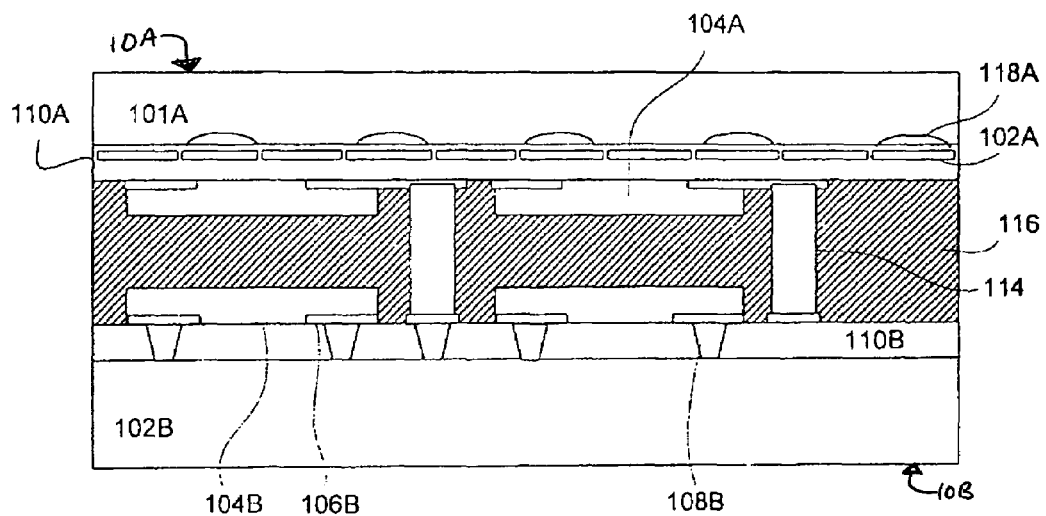
FIG. 8 shows a cross sectional view of a first example of the tri-band focal plane array architecture as shown in FIG. 7.

FIGS. 7 and 8 depict a tri-band focal plane array architecture. In this embodiment, each of the readout integrated elements 100A comprises at least one visible detector 102A in the form of a silicon CMOS or a CCD embedded in or formed in the thin transparent substrate 101A. When the visible detector 102A is in the form of CCD as shown in FIG. 8, charge packets 118A are formed and translated through the substrate of 10A using clocked gate structures, and the CCD is only connected to the readout integrated circuit 10B at a periphery thereof. The visible detector 102A is at least partially overlapped with the IR detector 104A deposited on the passivation layer 110A, while the IR detector 104A of the readout integrated circuit 10A is aligned over the IR detector 104B of the read integrated circuit 10B, such that three bands of light, including visible light, short wavelength IR light and medium wavelength IR light can be coincidentally detected when the IR detectors 104A and 104B are made of different materials. In this embodiment, the passivation layer 110A is a non-conductive material with a thickness sufficiently thick to isolate the IR detector 104A from the CCD. The alignment between the visible detector 102A, the IR detectors 104A and 104B is only required when the coincident characteristic is required.

FIG. 9 shows the architecture similar to that as shown in FIG. 8 except from the visible detector 102A. In this embodiment, the visible detectors 102A are in the form of CMOS integrated in the readout integrated circuit 10A, and the IR detectors 104A and 104B are deposited on the passivation layers 110A and 110B formed over the substrates 101A and 101B of the readout integrated circuits 10A and 10B, respectively. The CMOS visible detectors 102A can use any p-n junction available in the CMOS process. The readout integrated circuits 10A and 10B are packaged in a flip-chip format as shown in FIG. 9. The space between the readout integrated circuits 10A and 10B is filled with a backfill material 116, and conductive bumps 114 such as indium bumps are formed to extend through the backfill material 116, so as to connect the readout circuits 10A and 10B. The CMOS visible detectors 102A are interconnected with each other and/or with an internal readout circuit of the readout integrated circuit 10A by column and row busses and interconnections such as the well junction connection leads 118A. The active circuits of the CMOS visible detectors 102A cannot be illuminated, such that backside metal 120A blocks light from reaching these circuits, but with openings delineating the active areas of the visible detectors 102A and the IR detectors 104A and 104B. The embodiments as shown in FIG. 7 to FIG. 9 provide a focal plane array architecture operative to simultaneously detect signals at three different bands, including the visible band, slow-wavelength IR band and medium-wavelength IR band. Preferably, the pixels of the visible detectors 102A are formed to correspond to the pixels of the IR pixels such that the openings in the metal blocks 120 define the optically active areas coincide with the underlying visible and IR detectors 102A, 104A and 104B.

In the focal plane array architectures as shown in FIGS. 8 and 9, lead sulfide (PbS) or lead telluride (PbTe) can be used to form the IR detectors active in the short- or short-medium-wavelength IR ranges, while lead telluride or lead selenide (PbSe) can be used to form the IR detector active in the medium-wavelength IR range. When the IR detectors 104A and 104B are made of the same materials, the focal plane array architectures as shown provide dual-band detection instead of tri-band detection. However, as two IR focal plane arrays are provided, the absorption of the IR band is increased, the sensitivity increased. Consequently, the noise is reduced by summation to get an effective root square increase in signal-to-noise (S/N) ratio.

The above description is given by way of example, and not limitation. Given the above disclosure, one skilled in the art could devise variations that are within the scope and spirit of the invention disclosed herein, including various ways of arranging the holes in the cladding region. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A multi-band focal plane array architecture comprising:
    a first array of detector elements, comprising:
        a first semiconductor substrate having a first readout circuit integrated therein; and a plurality of first detectors integrated in the substrate and electrically connected to the first readout circuit, the plurality of first detectors includes a visible frequency detector being operative to absorb a signal at a first wavelength band;
    a second array of detector elements, comprising:
        a second semiconductor substrate having a second readout circuit; a plurality of second detectors disposed intermediate the first array and the second substrate and electrically connected to the second readout circuit, the plurality of second detectors including an infrared frequency detector being operative to absorb a signal at a second wavelength band;
    a third array of detector elements, comprising;
        a plurality of third detectors disposed intermediate the second array of detectors and the second substrate and electronically connected to the second readout circuit, the plurality of third detectors includes an infrared frequency detector being operative to absorb a signal at a third wavelength band; with the plurality of first detectors being transmissive to the second wavelength band; the second array of detector elements being packaged with the plurality of the second and third detectors facing each other and in substantial registry; and
    a passivation layer disposed between the first array of detector elements and the second array of detector elements for isolating the plurality of second detectors from the plurality of first detectors, the passivation layer being substantially transmissive in relation to the second and the third wavebands.

2. The architecture of claim 1, wherein the first and second arrays comprises M×N detector elements, and M and N are positive integers.

3. The architecture of claim 1, wherein the first and second substrates include a silicon substrate.

4. The architecture of claim 1, wherein the plurality of first detectors, the plurality of second detectors and the plurality of third detectors are operable at a temperature higher than cryogenic temperature.

5. The architecture of claim 1, wherein the first wavelength band includes wavelengths lower than 1.1 microns and the second and third wavelength bands include wavelengths lower than 3.0 microns, 4.5 microns or 5.0 microns.

6. The architecture of claim 1, wherein the first wavelength band includes visible band and the second wavelength band includes short-, short-medium-, or medium-wavelength infrared range.

7. The architecture of claim 6, wherein the short-medium wavelength infrared range includes wavelengths lower than about 4.5 microns, and the medium-wavelength infrared range includes wavelengths lower than 5.0 microns.

8. The architecture of claim 1, wherein each of the first array of detector elements further comprises a metal bus for connecting the plurality of first detectors to the readout circuit.

9. The architecture of claim 1, wherein the plurality of first detectors includes a CMOS detector operative to detect visible signal and the second detector includes an infrared detector.

10. The architecture of claim 1, wherein the first substrate is transparent to the first and second wavelength bands.

11. The architecture of claim 1, wherein at least one of the plurality of first detectors is at least partially overlapped with at least one of the plurality of second detectors.

12. The architecture of claim 1, wherein at least one of the plurality of first detectors includes a CCD.

13. The architecture of claim 1, wherein the first substrate is transparent to the first, second and third wavelength bands.

14. The architecture of claim 13, wherein the first detector includes a CMOS detector.

15. The architecture of claim 14, wherein each of the first array of detector elements further comprises a metal layer formed on the first substrate at a side opposite to each of the plurality of second detectors for blocking a circuitry for the CMOS detector.

16. The architecture of claim 15, wherein the metal layer is delineated with an opening aligned with active areas of the plurality of first, second and third detectors.

17. A multi-band focal plane array architecture, comprising:
a first integrated readout circuit having a first side and a second side, comprising:
a plurality of visible detectors formed within the second side of the first readout circuit, the visible detectors being operative to absorb a signal at a first wavelength band;
a second integrated readout circuit connected to the first integrated readout circuit, the second integrated readout circuit having a first side and a second side, the first side facing the second side of the first integrated readout circuit;
a plurality of first infrared detectors disposed intermediate the first readout circuit and the second readout circuit, the first infrared detectors being operative to absorb a signal at a second wavelength band,
a plurality of second infrared detectors disposed intermediate the plurality of first infrared detectors and the second readout circuit, the second infrared detectors being operative to absorb a signal at a third wavelength band, the first infrared detectors being in substantial registry with the second infrared detectors; and
a passivation layer disposed between the plurality of visible detectors and the plurality of first infrared detectors, the passivation layer being substantially transmissive in relation to the second and the third wavebands.

18. The architecture of claim 17, wherein the visible detectors and the first infrared detectors are arranged in a checkerboard pattern.

19. The architecture of claim 17, wherein the visible detectors and the first infrared detectors are arranged in alternate rows.

20. The architecture of claim 17, wherein the infrared detectors are operative to detect a short-, medium- or short-medium-wavelength infrared signal.

21. The architecture of claim 17, wherein the visible detectors are at least partially aligned under the first infrared detectors so that the first and second wavelength bands are simultaneously detected.

22. The architecture of claim 21, wherein the first readout circuit is transparent to the responsive wavelength bands of the visible and first infrared detectors.

23. The architecture of claim 22, wherein the visible detectors include CMOS detectors or CCD detector.

24. The architecture of claim 23, further comprising a metal layer operative to prevent circuitry for the visible detectors from being illuminated when the CMOS detectors are selected as the visible detectors.

25. The architecture of claim 22, further comprising a metal layer operative to prevent a circuitry for the first detectors from being illuminated.

26. The architecture of claim 25, wherein the metal layer is delineated with a plurality of openings aligned with active areas of the visible and infrared detectors.

27. The architecture of claim 17, further comprising a layer of backfill material filling a space between the first and second readout circuits.

28. The architecture of claim 17, further comprising a plurality of conductive bumps for connecting the readout circuits integrated in the first and second readout circuits.

29. The architecture of claim 17, further comprising a passivation layer formed between the second readout circuit and the second infrared detectors.

30. The architecture of claim 17, wherein the visible detectors and the first and second infrared detectors are non cryogenic detectors.

31. The architecture of claim 17, further comprising a backfill layer intermediate the second and the third detectors, the backfill layer being substantially transmissive in relation to the third waveband.

32. The architecture of claim 17, wherein the passivation layer being formed of a thickness sufficient to isolate the first and the second detectors, while minimizing lag time between incidence of light on the first and second detectors.

* * * * *